(12) United States Patent
Gohel et al.

(10) Patent No.: US 10,564,219 B2
(45) Date of Patent: Feb. 18, 2020

(54) TIME-ALIGNING COMMUNICATION CHANNELS

(71) Applicant: Teradyne, Inc., North Reading, MA (US)

(72) Inventors: Tushar K. Gohel, Winchester, MA (US); Xiaohan Hu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 66 days.

(21) Appl. No.: 15/661,198

(22) Filed: Jul. 27, 2017

(65) Prior Publication Data

US 2019/0033372 A1    Jan. 31, 2019

(51) Int. Cl.
| | |
|---|---|
| *G01R 31/28* | (2006.01) |
| *G01R 31/317* | (2006.01) |
| *G01R 35/00* | (2006.01) |
| *G01R 31/3193* | (2006.01) |
| *G01R 31/319* | (2006.01) |
| *G01R 31/3177* | (2006.01) |
| *G01R 31/30* | (2006.01) |

(52) U.S. Cl.
CPC ... *G01R 31/31726* (2013.01); *G01R 31/3177* (2013.01); *G01R 31/3191* (2013.01); *G01R 31/31937* (2013.01); *G01R 35/005* (2013.01); *G01R 31/3016* (2013.01)

(58) Field of Classification Search
CPC .............. G11C 29/56; G11C 29/56012; G11C 2029/56; G01R 31/31725; G01R 31/31726; G01R 31/3177; G01R 31/318328; G01R 31/31858; G01R 31/31937

USPC ......................................... 714/726, 731, 742
See application file for complete search history.

(56) References Cited

U.S. PATENT DOCUMENTS

| | | | |
|---|---|---|---|
| 4,135,397 A | 1/1979 | Krake | |
| 4,734,637 A | 3/1988 | Chen et al. | |
| 4,849,702 A * | 7/1989 | West ................ | G01R 31/31713 327/160 |

(Continued)

FOREIGN PATENT DOCUMENTS

WO    2009/079789 A1    7/2009

OTHER PUBLICATIONS

International Search Report for PCT/US2018/040246, 5 pages (dated Oct. 10, 2018).

(Continued)

*Primary Examiner* — Albert Decady
*Assistant Examiner* — Osman M Alshack
(74) *Attorney, Agent, or Firm* — Burns & Levinson LLP (57) ABSTRACT

An example process for aligning channels in automatic test equipment (ATE) includes programming a first delay associated with receiving first data over a channel so that timing of the channel is aligned to timings of other channels in the ATE; programming a second delay associated with a driver driving second data over the channel based on receipt of an edge of the second data so that timing of the second data is aligned to the timing of the channel; and programming a third delay associated with a signal to enable the driver to drive the second data over the channel, with the third delay being programmed to align timing of the signal to the timing of the channel, and with the third delay being based on an edge that corresponds to an edge of the signal created by controlling operation of the driver.

16 Claims, 6 Drawing Sheets

(56) References Cited

U.S. PATENT DOCUMENTS

| | | |
|---|---|---|
| 4,858,208 A | 8/1989 | Swapp |
| 5,321,632 A | 6/1994 | Otsuji et al. |
| 5,867,030 A | 2/1999 | Sato |
| 6,262,602 B1 | 7/2001 | Draving |
| 6,298,465 B1 * | 10/2001 | Klotchkov ....... G01R 31/31725 327/156 |
| 6,366,115 B1 | 4/2002 | DiTommaso |
| 6,563,352 B1 | 5/2003 | Gohel et al. |
| 6,625,206 B1 | 9/2003 | Doblar |
| 6,784,819 B2 * | 8/2004 | Chow ................ G01R 31/2834 324/532 |
| 6,894,505 B2 | 5/2005 | Gohel |
| 7,009,382 B1 * | 3/2006 | Hickling ........... G01R 31/3191 324/750.02 |
| 7,120,840 B1 * | 10/2006 | Shimanouchi ..... G01R 31/3191 714/700 |
| 7,388,657 B2 | 6/2008 | Abbott |
| 7,395,479 B2 | 7/2008 | Gohel et al. |
| 7,420,375 B2 | 9/2008 | Gohel |
| 8,310,270 B2 | 11/2012 | Gohel et al. |
| 8,988,081 B2 | 3/2015 | Gohel et al. |
| 2004/0056666 A1 | 3/2004 | Gohel |
| 2004/0232919 A1 | 11/2004 | Lacey |
| 2005/0039079 A1 * | 2/2005 | Higashi ............. G01R 31/3183 714/28 |
| 2005/0057257 A1 | 3/2005 | Fleischman |
| 2005/0146320 A1 | 7/2005 | Gohel |
| 2005/0193275 A1 | 9/2005 | Gohel |
| 2006/0010358 A1 | 1/2006 | Miller |
| 2006/0123305 A1 | 6/2006 | Linam et al. |
| 2006/0161827 A1 | 7/2006 | Gohel et al. |
| 2006/0236157 A1 * | 10/2006 | Huang ............... G01R 31/3191 714/700 |
| 2009/0091347 A1 | 4/2009 | Gohel et al. |
| 2009/0174420 A1 | 7/2009 | Ariyama et al. |
| 2010/0176815 A1 | 7/2010 | Roth |
| 2010/0229053 A1 * | 9/2010 | Kushnick ........... G01R 31/3016 714/704 |
| 2012/0043994 A1 | 2/2012 | Alvarez Valenzuela et al. |
| 2012/0106351 A1 | 5/2012 | Gohel et al. |
| 2012/0286898 A1 | 11/2012 | Chinn |
| 2012/0313618 A1 * | 12/2012 | Phillips ............. G01R 31/3191 324/74 |
| 2012/0319752 A1 | 12/2012 | Qu et al. |
| 2013/0106399 A1 | 5/2013 | Gohel et al. |
| 2013/0124134 A1 | 5/2013 | Gohel |
| 2014/0361798 A1 * | 12/2014 | Johnson ............... G01R 35/005 324/750.02 |
| 2017/0244542 A1 * | 8/2017 | Luce ................... H04L 27/0002 |
| 2018/0316420 A1 | 11/2018 | Gohel et al. |
| 2018/0316421 A1 | 11/2018 | Gohel et al. |
| 2018/0316423 A1 | 11/2018 | Gohel et al. |
| 2018/0316424 A1 | 11/2018 | Gohel et al. |
| 2018/0316990 A1 | 11/2018 | Gohel et al. |

OTHER PUBLICATIONS

Written Opinion for PCT/US2018/040246, 9 pages (dated Oct. 10, 2018).

International Preliminary Report on Patentability dated May 15, 2014 in international application No. PCT/US2012/056228, 7 pgs.

* cited by examiner

TIME-ALIGNING COMMUNICATION CHANNELS

TECHNICAL FIELD

This specification relates generally to time-aligning communication channels.

BACKGROUND

Automatic test equipment (ATE) having multiple output communication channels may require timing alignment between those channels in order to perform parallel tasks. Channel-to-channel timing alignment involves transmitting and receiving signals at precise points in time. In an example, each of the multiple channels is capable of bi-directional functionality. Drivers on those channels are capable of being disabled quickly (referred to as tri-stating) so that their output does not affect signals being transmitted back along the channels by a unit under test (UUT). Drive enable signals (tri-state signals) that enable and disable each driver output are different from drive data signals that control driver output to drive a logic high state or logic low state. The drive data signals and the drive enable signals do not always align in time, which can impact performance of the ATE.

SUMMARY

An example process for aligning channels in automatic test equipment (ATE) includes programming a first delay associated with receiving first data over a channel so that timing of the channel is aligned to timings of other channels in the ATE; programming a second delay associated with a driver driving second data over the channel based on receipt of an edge of the second data so that timing of the second data is aligned to the timing of the channel; and programming a third delay associated with a signal to enable the driver to drive the second data over the channel, with the third delay being programmed to align timing of the signal to the timing of the channel, and with the third delay being based on an edge that corresponds to an edge of the signal created by controlling operation of the driver. The example process may include one or more of the following features, either alone or in combination.

Controlling operation of the driver may comprise driving initial data in a first state; using the signal to turn the driver off for a period of time; pre-loading the driver with the second data in a second state; and using the signal to turn the driver on, thereby outputting the second data having the edge that corresponds to the edge of the signal.

The example process may comprise receiving the edge of the second data; comparing the edge of the second data to a reference voltage; and determining the second delay based on the comparison. The edge of the second data may be an incident edge of the second data, or the edge of the second data may be a reflected edge of the second data. A reflected edge may be produced by reflection of the second data over an open-ended transmission line.

The example process may comprise receiving the edge that corresponds to the edge of the signal; comparing the edge that corresponds to the edge of the signal to an edge of the first data; and determining the third delay based on the comparison. The edge that corresponds to the edge of the signal may be an incident edge of second data created by controlling operation of the driver. The edge that corresponds to the edge of the signal may be a reflected edge of second data created by controlling operation of the driver. The reflected edge may be produced by reflection of the second data created by controlling operation of the driver over an open-ended transmission line.

The first delay, the second delay, and the third delay may comprise fine delays. The example process may comprise programming coarse delays associated with receiving the first data over the channel and driving the second data over the channel, with the coarse delays being longer in time than the fine delays. Controlling operation of the driver may comprise turning the driver on and off.

Example automatic test equipment (ATE) comprises a channel to send data to a unit under test (UUT), and to receive data from the UUT; a first circuit comprising a first delay element that is programmable, with the first circuit being configured to receive first data over the channel; a second circuit comprising a second delay element that is programmable, with the second circuit comprising a driver to drive second data over the channel; and a third circuit comprising a third delay element that is programmable, with the third circuit being configured to provide a signal to control operation of the driver. The first delay element is programmed with the first delay so that timing of the channel is aligned to timings of other channels on the ATE. The second delay element is programmed with a second delay that is based on receipt of an edge of the second data so that timing of the second data is aligned to the timing of the channel. The third delay element is programmed with the third delay to align timing of the signal to the timing of the channel. The third delay may be based on an edge that corresponds to an edge of the signal created by controlling operation of the driver. The example ATE may include one or more of the following features, either alone or in combination.

The first delay element may comprise one or more delay elements, the second delay element may comprise one or more delay elements, and the third delay element may comprise one or more delay elements. The first circuit, the second circuit, and the third circuit may be implemented in programmable logic.

Timings associated with the second circuit and the third circuit may change in accordance with programming of the programmable logic. Programming the first delay, programming the second delay, and programming the third delay may be performed in any order. At least one of programming the first delay, programming the second delay, and programming the third delay includes performing the programming to achieve time-alignment to a common reference.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below.

Other features, objects, and advantages will be apparent from the description and drawings, and from the claims.

DESCRIPTION OF THE DRAWINGS

Like reference numerals in different figures indicate like elements.

DETAILED DESCRIPTION

Described herein are examples of processes, which may be performed on ATE, to time-align drive enable (tri-state) signals to other channel signals. The processes operate by recognizing that communication channel—or simply, channel—output remains near the same level for a certain period of time (shown as T0 in FIG. 4 and FIG. 5) after disabling the output, and that this the period of time is sufficiently long to re-enable the channel and drive the channel to another programmed level. As described herein, this behavior enables alignment of a channel enable signal (the drive enable signal) to a channel state transition (the drive data signal) based on a timing relationship difference between the drive enable signal affecting the output and the drive data signal affecting the output. Such alignment can be beneficial, for example, when there are propagation delay differences between the drive data signal and the drive enable signal, since it can lead to more predictable and precise ATE output.

The example processes described herein can be used with any appropriate hardware to align multiple drive data signals, drive enable signals, and receive data signals. In the examples described herein, the hardware used includes programmable logic—in an example, a field programmable gate array (FPGA)—that implements all or part of ATE. The FPGA is referred to as a test-defined FPGA, since it may be custom-configured to implement a particular testing regimen to be performed on a particular unit under test (UUT), and then may be reconfigured to implement a different testing regimen on the same, or a different, UUT. A UUT, in this context, includes any appropriate device(s), method(s), and/or system(s) that are tested by the ATE.

To perform timing alignment, the timing relationship of data and clock signals from the test-defined FPGA to the UUT is determined and accounted for during test development. There are three factors to consider when time-aligning channels between the FPGA/ATE and the UUT: drive data timing and skew, drive enable timing and skew, and detect (or, receive) data timing and skew. These are as described below.

Detect data skew is the skew between each of the channels when transmitted signals from the UUT are sampled by the test-defined FPGA. In an example, the ATE supports a strobe mode; therefore, detection is configured to account for propagation delay variations in the channel path from the UUT interface to the test-defined FPGA.

Drive data skew is the skew between each of the channels for signals transmitted out of the test-defined FPGA that appear at the end of a cable or other type of transmission line connecting the ATE to the UUT. In some implementations, it is desirable for all of the data lines to be time-aligned and stable when a clock signal is asserted, since that can increase ATE reliability.

Drive enable skew is the skew between each of the channels for signals enabled or disabled out of the test-defined FPGA that appear at the end of a cable or other type of transmission line connecting the ATE to the UUT. In some implementations, it is desirable for all of the data lines that are enabled or disabled to be time-aligned and stable when a clock signal is asserted, since that can increase ATE reliability.

Both the drive data and drive enable signals may impact data transmission depending on a current state of an output. The drive data signal can drive the data high or low, and the drive enable signal can also drive the data high or low when the drive enable signal is transitioning from disable to enable (depending on the state of drive data). In some cases, the timing associated with the drive enable timing may be more coarse than the timing associated with the drive data timing. The data is enabled and disabled when the transmission on the channel changes direction. During this period, a test developer may allow enough time for signals to propagate through a cable before a drive data buffer is enabled and disabled. For example, when the test-defined FPGA is done transmitting, the test-defined FPGA will not receive a signal from the UUT until the transmission from the test-defined FPGA reaches the UUT, the UUT transmits a signal back to the test-defined FPGA, and the signal from the UUT propagates back to the test-defined FPGA. This round-trip time becomes a time buffer that, in some cases, causes the timing of tri-stating the channel to be less precise than the drive data timing.

The cable referred to herein may include one or more wires or other transmission media that are connected to the communication channel between the test-defined FPGA and the UUT. The cable may have different lengths, which may depend upon the test configuration. The cable affects the timing of the data transmission and reception depending on where a voltage threshold—VREF—is set. The threshold voltage VREF determines the voltage at which the signal is recognized as a logic one or a logic zero.

Figure 1:
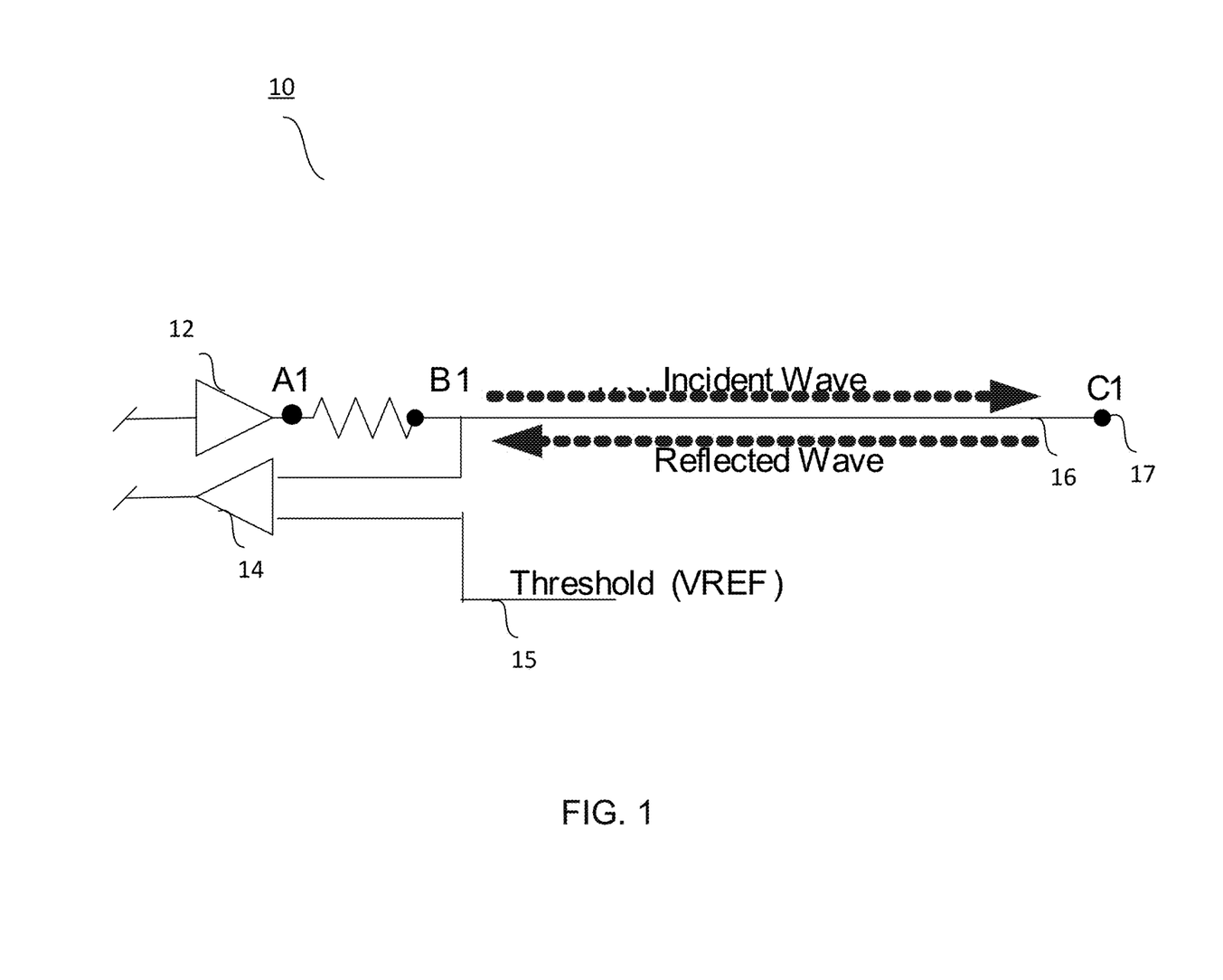
FIG. 1 is diagram of part of a generic communication channel.
Figure 2:
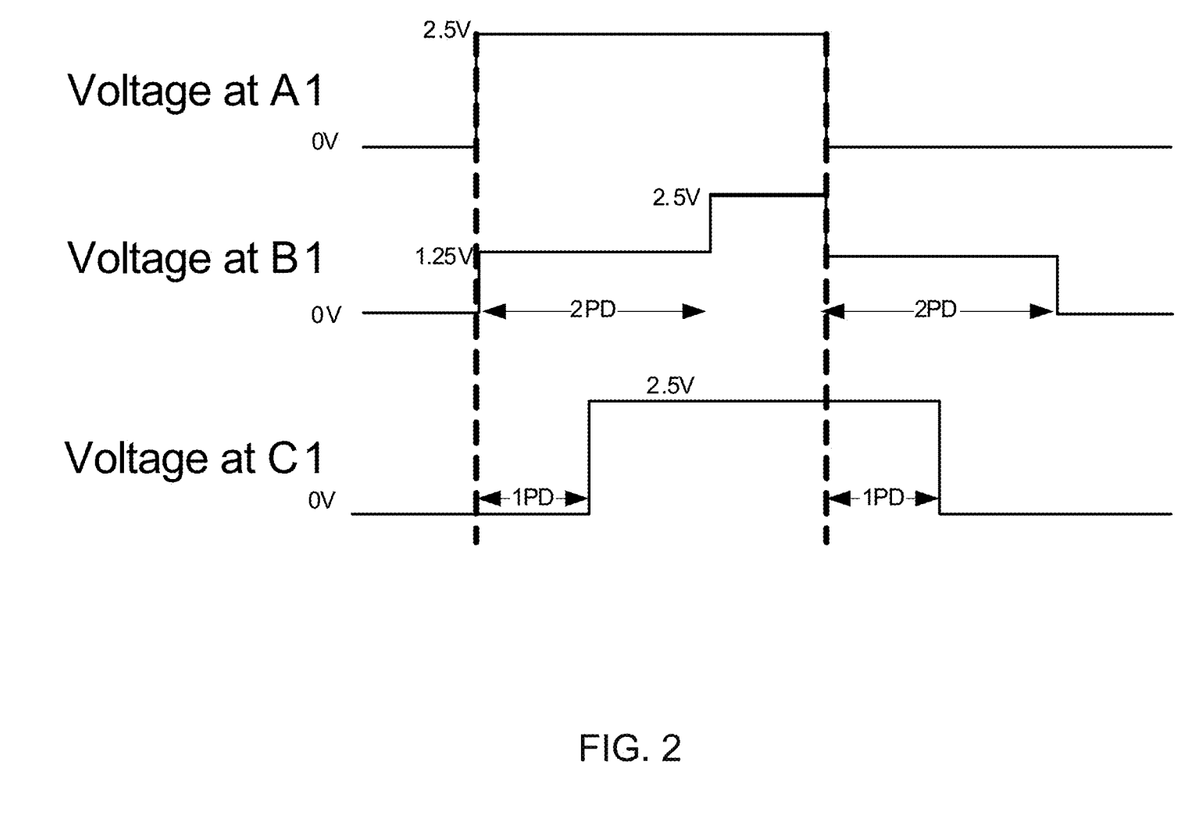
FIG. 2 depicts graphs showing signal levels at various points in a communication channel and along a cable connected thereto.

FIG. 1 shows an example of part of a communication channel 10 containing a driver 12, a receiver 14 such as a comparator, and a voltage threshold VREF 15, applied to the receiver. When a signal—also referred to as an edge—is transmitted onto cable 16, there is an incident wave that propagates from the output of the driver to the end 17 of the cable. Then, there is a reflected wave that propagates from the end of the cable back to the channel. The terms incident edge and reflected edge may be used synonymously with incident wave and reflected wave. Furthermore, the end of the cable may be an open end, and the cable need not be any particular type of cable, but rather may be any appropriate type of transmission line. FIG. 2 depicts, graphically, levels of signals transmitted along the channel of FIG. 1.

Referring also to FIG. 1, FIG. 2 shows that when a signal at location A1 transitions from low (in this example, 0V) to high (in this example, 2.5V), the voltage at B1 initially rises to ½ of the maximum amplitude (in this example, 1.25V)

and then rises to the full amplitude (in this example, 2.5V) when the reflected wave returns. In FIG. 2, "PD" represents "propagation delay", which is the time that it takes the output signal to move from one end of the cable to the other end of the cable. The foregoing concept can be used to time-align the channels. For rising edges, if the signal detected by receiver 14 is compared to a threshold (VREF) below the midpoint of the voltage swing, then the propagation delay through the cable is ignored. Furthermore, if the signal detected by receiver 14 is compared to a threshold (VREF) above the midpoint of the voltage swing, then the propagation delay through the cable is included. For falling edges the opposite is true. If there were a time reference for each channel, every channel in the ATE can be aligned using measurements made by changing the levels and testing the signals.

Figure 3:
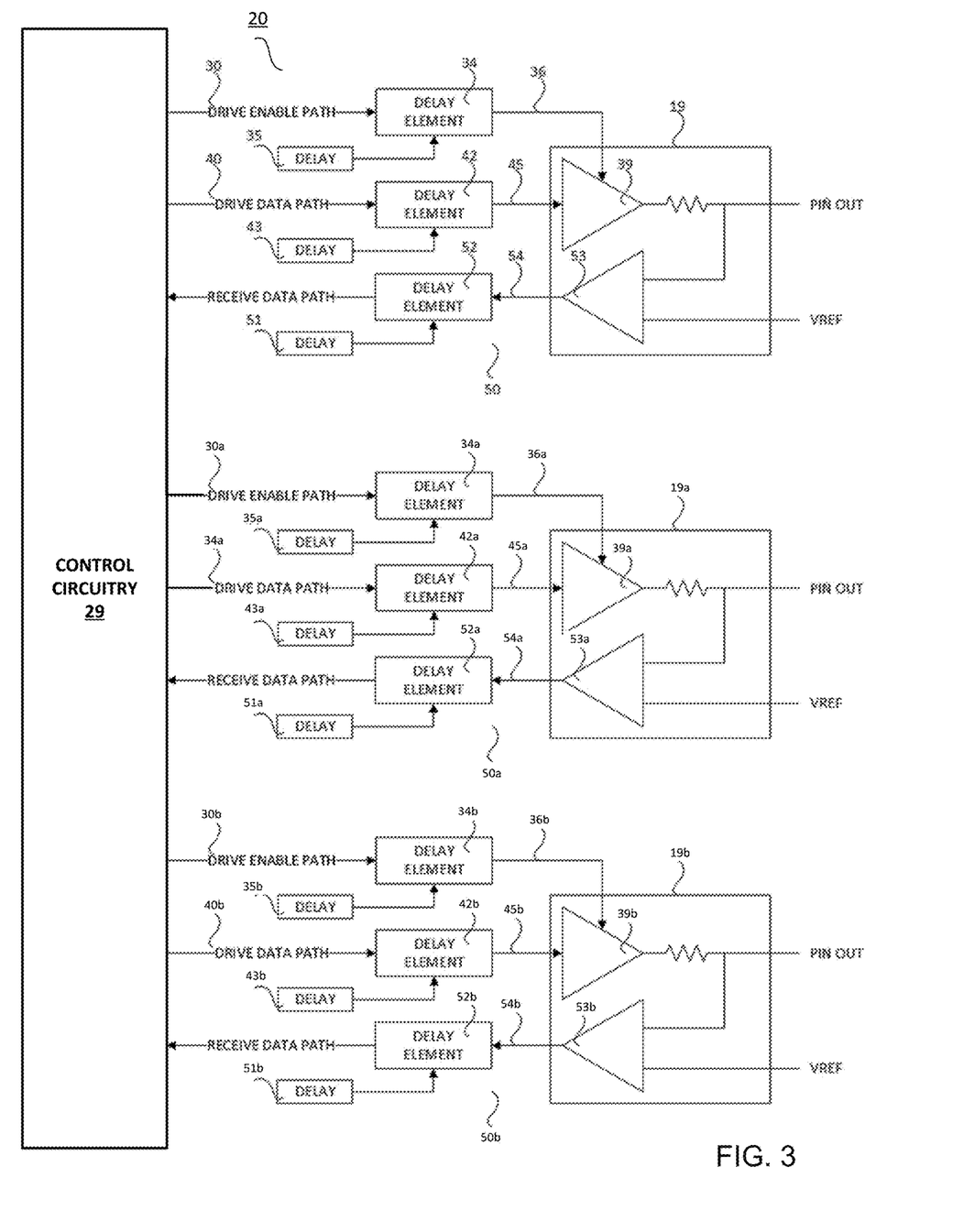
FIG. 3 is a block diagram showing components of example communication channels that may be implemented using programmable logic.

FIG. 3 is a diagram showing components of example ATE. The components may be implemented using programmable logic, such as a test-defined FPGA 20. The example ATE includes a channel 19, which may be one of multiple identically-configured channels. In this regard, the example ATE of FIG. 3 includes three channels, labeled 19, 19a, and 19b. Although only three channels are shown, any appropriate number of channels may be implemented within the ATE and time-aligned as described herein. Channel 19 will be discussed below. The elements of channels 19a and 19b labeled with "a" or "b" may be identical in structure and function to corresponding elements of channel 19 not labeled with "a" or "b". For example, delay elements 34, 34a, and 34b may use the same circuitry, drivers 39, 39a, and 39b may use the same circuitry, and so forth. The example ATE includes control circuitry 29, which may include any appropriate circuitry to generate, and to output, data and control signals.

For each channel, the example ATE includes one or more delay elements that are configurable to control timing of the drive data signal, the drive enable signal, and the detect data signal. By virtue of this configuration, delays may be programmed in any appropriate order into different paths of the FPGA, including into the path for the drive enable signal, the path for the drive data signal, and the path for receiving and detecting data. The delays may be programmed into delay elements, such as one or more buffers or registers, in a signal path. In FIG. 3, one delay element per path (drive data, drive enable, and receive data) is shown; however, in some implementations, more than one delay element per path may be used. The delay elements are used to compensate for propagation delay differences.

As shown in FIG. 3, path 30 (the drive enable path) receives a drive enable signal from control circuitry 29; the drive enable signal is delayed through delay element 34 by a programmed delay amount 35; and path 36 provides the drive enable signal to the enable/disable input of driver 39. As also shown in FIG. 3, path 40 (the drive data path) receives a drive data signal from control circuitry 29; the drive data signal is delayed through delay element 42 by a programmed delay amount 43; and path 45 provides the drive data signal to the input terminal of driver 39 for output in response to the drive enable signal. The drive data signal and the drive enable signal are time-aligned to control the driver 39 output at, or about, the same time based on the programmed delays (35 and 43, respectively) from delay elements 34 and 42.

The detect (or, receive data path) portion 50 of channel 19 receives data from the UUT, and time-aligns that data based on a delay 51 programmed into delay element 52 before providing the data to control circuitry 29 for processing. As described herein, test-defined FPGA 20 may be configured to enable receive portions of different channels (e.g., 19, 19a, 19b) of the ATE to be time-aligned to each other by programming each with an appropriate delay. The example process described herein is also implemented to time-align the drive enable and drive data paths to the receive portion of channel 19. By performing such an alignment for each channel—e.g., for channels 19, 19a, and 19b—the drive enable and drive data paths will therefore be aligned to each receive portion of each channel. And, because the drive enable and drive data paths of each other channel are also time-aligned to their respective receive portions, the drive data paths and drive enable paths of all data channels are also time-aligned. Accordingly, the example processes described herein enable time-alignment of all or some channels to a common reference. The processes can be repeated for different test configurations of the FPGA necessitated by different test configurations.

Channel 19 is configured to send data to a UUT, and to receive data from the UUT. The example ATE includes a first circuit (e.g., path 54) comprising a first delay element 52 that is programmable to produce delay 51. The first circuit is configured to receive data over the channel. The example ATE includes a second circuit (e.g., paths 40 and 45) comprising a second delay element 42 that is programmable to produce delay 43. The second circuit includes a driver 39 to drive data over the channel. The example ATE includes a third circuit (e.g., paths 30 and 36) comprising a third delay element 34 that is programmable to produce delay 35. The third circuit is configured to provide a signal to control operation of (e.g., to enable/disable) the driver. In this example, the first delay element is programmed to produce the first delay 51 so that timing of the channel is aligned to timings of other channels (e.g., 19a and 19b) on the ATE; the second delay element is programmed to produce the second delay 43 that is based on receipt of an edge of the second data so that timing of the second data is aligned to the timing of the channel; and the third delay element is programmed to produce the third delay 35 to align timing of the signal to the timing of the channel. The third delay is based on an edge that corresponds to an edge of the signal created by controlling operation of the driver. Coarse delays, which are delays that are generally longer than the delays programmed into the delay elements 34, 42, 52, may also be applied to signals by control circuitry 29 in order to support alignment.

In an example implementation, coarse delays have a 1 nanosecond (ns) resolution while the delays in delay elements 34, 42, and 52 have a full scale delay of 5 ns with a resolution of 78 picoseconds (ps) (in 64 intervals). The delay elements 34, 42, and 52 may be programmable during testing or prior to testing. In the example of FIG. 3, the paths 30, 40, and 54 have predictable matched timing within the test-defined FPGA. Paths 36 and 45 have timing that could be based on the programming of the FPGA and, therefore, that may vary depending upon the programming of the FPGA.

In some examples, a properly aligned system includes driver signals that appear at the UUT with little or no timing skew, and detected signals from the UUT with little or no timing skew. For example, if channel 19 were programmed to transition at 8 ns with respect to a reference clock, and channel 19a were programmed to transition at 8 ns with respect to the reference clock, ideally, the transitions would appear at the end of their respective cables at the same time even if those cables have different lengths. This implies that the channel with the shorter cable may have to transmit the signal out of a communication cell a later in time than the channel with the longer cable. Other factors such as the internal routing of paths 36 and 45 are also taken into account in the example time-alignment processes described herein. For example, if path 36 has a longer propagation delay than a path 45, then the will be delayed by that amount.

To properly align channels, at least one path among paths 36, 45, and 54 has deterministic skews. In this example, path 36 and 45 are mismatched. Path 54 (the receive data path) is fixed on every channel of the ATE (e.g., channels 19, 19a, 19b), and the clock distribution to the data has a relatively low channel-to-channel skew. Path 54 therefore has the deterministic skew. Consequently, a receiver implemented in the receive data path acts as a timing reference. The timing alignment described herein is performed to align the timing of the paths. In hardware other than that described herein, different paths may have different fixed and variable timings, which may necessitate correction of timing in different paths.

Figure 4:
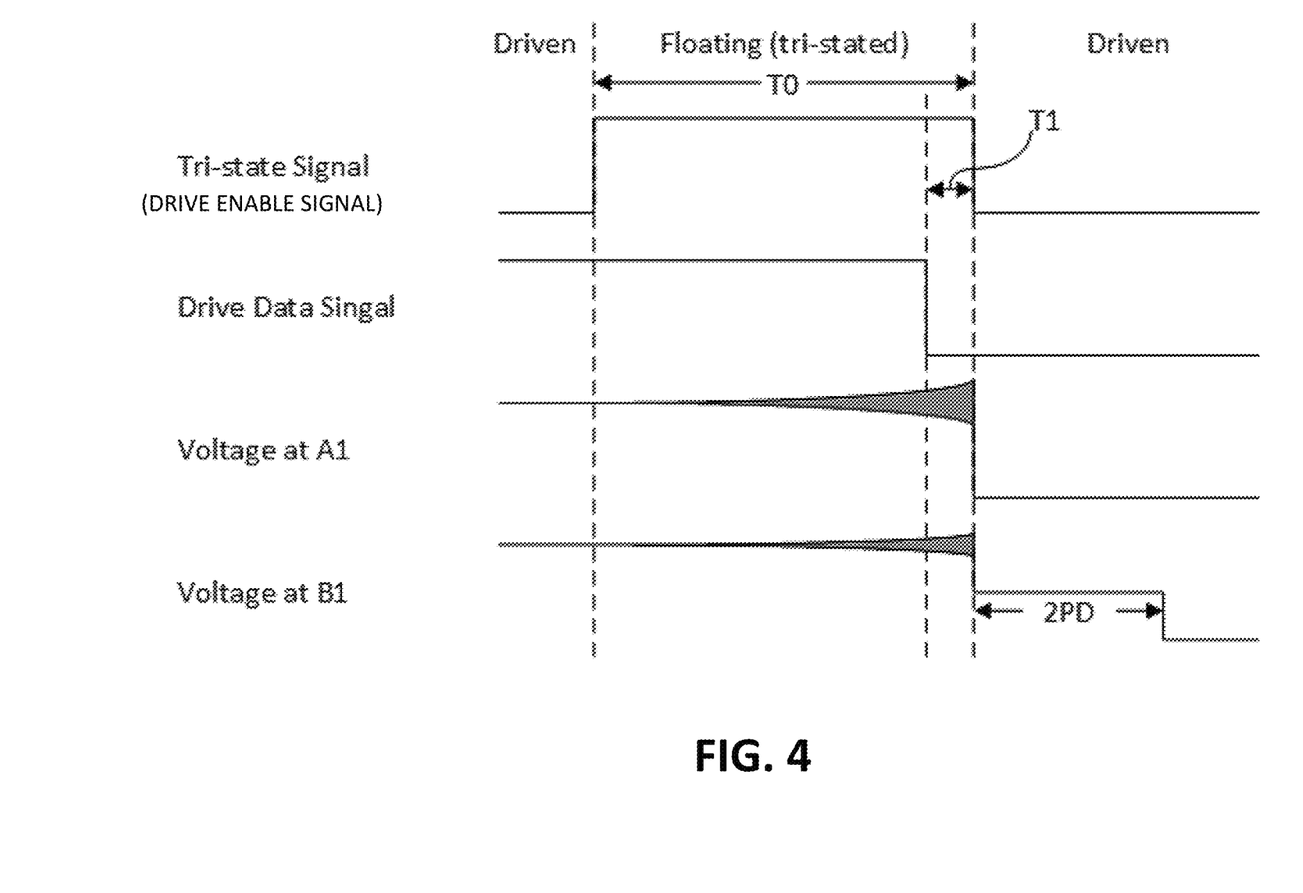
FIG. 4 is a diagram showing generation of a high-to-low transition on an example communication channel during tri-state signal alignment.

An example process for performing time alignment includes the following: programming a first delay (e.g., into delay element 52) associated with receiving first data over a channel so that the receive timing of the channel is aligned to the receive timings of other channels (e.g., 19a and 19b) in the ATE; programming a second delay (e.g., into delay element 42) associated with a driver driving second data over the channel based on receipt of an edge of the second data so that timing of the second data is aligned to the receive timing of the channel; and programming a third delay (e.g., into delay element 34) associated with a signal to enable the driver to drive the second data over the channel. The third delay is programmed to align timing of the signal to the receive timing of the channel, and the third delay is based on an edge that corresponds to an edge of the signal created by controlling operation of the driver. A procedure is followed to create the edge using the enable/disable signal since an incident edge is produced if the voltage at the output, when disabled, is different from the voltage at the output, when enabled, as shown in FIG. 4 and in FIG. 5. Operation of the driver is controlled, e.g., by driving initial data in a first state (e.g., a high state, such as 2.5V); using the enable signal to turn the driver off for a period of time; pre-loading the driver with second data in a second state (e.g., a low state, such as 0V); and using the enable signal to turn the driver on, thereby outputting the second data having the edge that corresponds to the edge of the signal. An edge in the opposite direction can be created using a similar process.

In some implementations, the inherent delay in the detect/receive portion 50 of each channel in the ATE is determined beforehand, at least because there is not programmable variability in that part of the channel. Accordingly, the delay elements of the detect/receive portion of each channel of the ATE, or a desired subset thereof, are programmed with appropriate time delays to time-align the detect/receive portion of those channels to each other. The time-alignment incorporates a delay into the channel so that the data is received at a time that the data is expected to be received. This timing may be vary depending upon factors such as the test configuration and the UUT.

In some implementations, the drive data signal is time-aligned to the detect/receive portion of each channel. For example, the drive data signal is output from driver 39 and is detected at receiver 53. The incident edge of the signal is compared to a VREF value that is below the midpoint of the voltage swing for reasons explained with respect to FIG. 2. In an example, the incident edge may be compared to a VREF value that is 25% of the maximum amplitude of the data signal. For example, the comparison may be to detect that the received signal is above the 25% value but below some other value that is less than the maximum signal level. The time at which the incident edge is received is compared to an expected receipt time. To the extent that the two deviate, a delay may be programmed into delay element 42 so that the actual receipt time coincides with the expected receipt time. If the timing alignment is accounting for cable length, the reflected edge (e.g., the edge reflected from the end of the cable) is compared to a VREF value that is above the midpoint of the voltage swing for reasons explained with respect to FIG. 2. In an example, the reflected edge may be compared to a VREF value that is 75% of the maximum amplitude of the data signal. For example, the comparison may be to detect that the received signal is above the 75% value. The time at which the reflected edge is received is compared to an expected receipt time. To the extent that the two deviate, a delay may be programmed into delay element 42 so that the actual receipt time coincides with the expected receipt time. Because the reflected edge is used, cable length is accounted for in the time alignment. Coarse delays may also be adjusted as appropriate by control circuitry 29.

Figure 5:
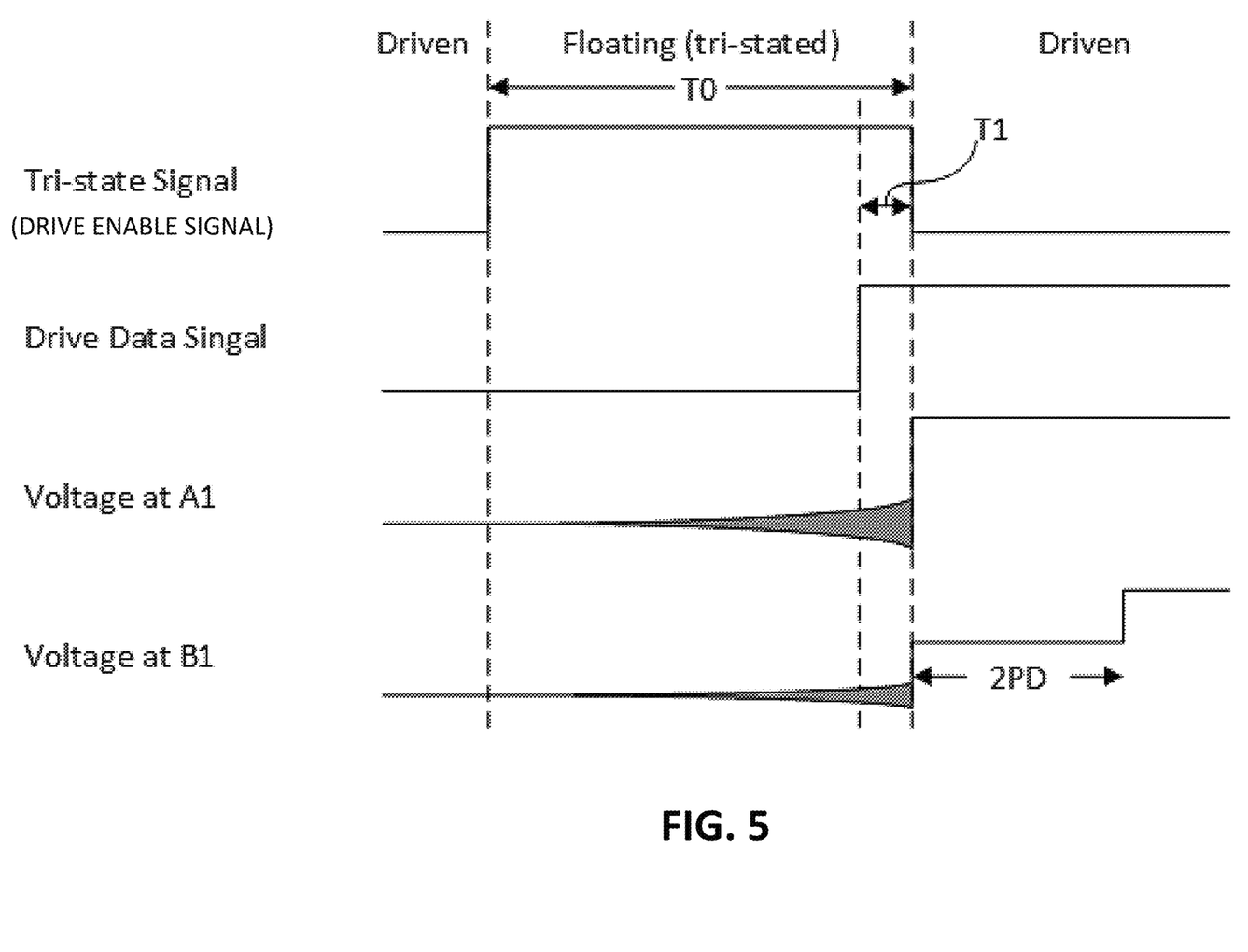
FIG. 5 is a diagram showing generation of a low-to-high transition on an example communication channel during tri-state signal alignment.

In some implementations, the drive enable signal is also time-aligned to the detect/receive portion (e.g., detect/receive portions 50, 50a, 50b) of each channel (and thus also to the drive data signal). In a given channel, such as channel 19, the drive enable signal is time-aligned to the detect/receive portion of the channel by creating a signal edge based on the drive enable (tri-state) signal. In an example as shown in FIG. 4 and FIG. 5, an edge is created that coincides with the timing of the drive enable signal as follows. The drive data signal is driven to an initial state—in this example, a logic high state. The drive enable signal is applied to turn driver 39 off for a period of time (T0), short enough to allow channel to remain at a logic high level. Driver 39 is pre-loaded with a drive data signal at a logic low state. The drive enable signal is then applied (time T1 later) to turn driver 29 on for a period of time, thereby outputting the drive data in a logic low state. The result is a signal edge—that is, a signal transition—from a logic high state to a logic low state that coincides in time with the drive enable signal. This signal edge may be used to align the timing of the drive enable signal to the timing of the receive portion of the channel as described herein.

More specifically, because the edge of the signal output by the driver coincides in time with the drive enable signal, a time delay to time-align that edge can also be used to time-align the drive enable signal. Time-alignment proceeds as described above. For example, the signal is output from driver 39 and the signal's edge is detected at receiver 53. The signal's incident edge is compared to a VREF value that is below the midpoint of the voltage swing for reasons explained with respect to FIG. 2. In an example, the incident edge may be compared to a VREF value that is 25% of the maximum amplitude of the data signal. The time at which the incident edge is received is compared to an expected receipt time. To the extent that the two deviate, a delay may be programmed into delay element 34 so that the actual receipt time coincides with the expected receipt time. If the timing alignment is accounting for cable length, the signal's reflected edge (reflected from the end of the cable) is compared to a VREF value that is above the midpoint of the voltage swing for reasons explained with respect to FIG. 3. In an example, the reflected edge may be compared to a VREF value that is 75% of the maximum amplitude of the data signal. The time at which the reflected edge is received is compared to an expected receipt time. To the extent that the two deviate, a delay may be programmed into delay element 34 so that the actual receipt time coincides with the expected receipt time. Coarse delays may also be adjusted, as appropriate, by control circuitry 29.

In the foregoing example, the signal edge used for time-aligning the drive enable signal is the transition from logic high to logic low. In some implementations, the signal edge used for time-aligning the drive enable signal may be the transition from logic low to logic high. For example, an edge may be created that coincides in time with the drive enable signal as follows. The drive data signal is driven to an initial state—in this example, a logic low state. The drive enable signal is applied to turn driver 39 off for a period of time, thereby allowing the drive data to stabilize at a logic low level. Driver 39 is pre-loaded with a drive data signal at a logic high state. The drive enable signal is then applied to turn driver 39 on for a period of time, thereby outputting the drive data in a logic high state. The result is a signal edge—that is, a signal transition—from a logic low state to a logic high state that coincides in time with the drive enable signal. This signal edge may be used to align the timing of the drive enable signal to the timing of the receive portion of the channel a manner similar to that described above where the logic high to logic low signal edge was used.

Figure 6:
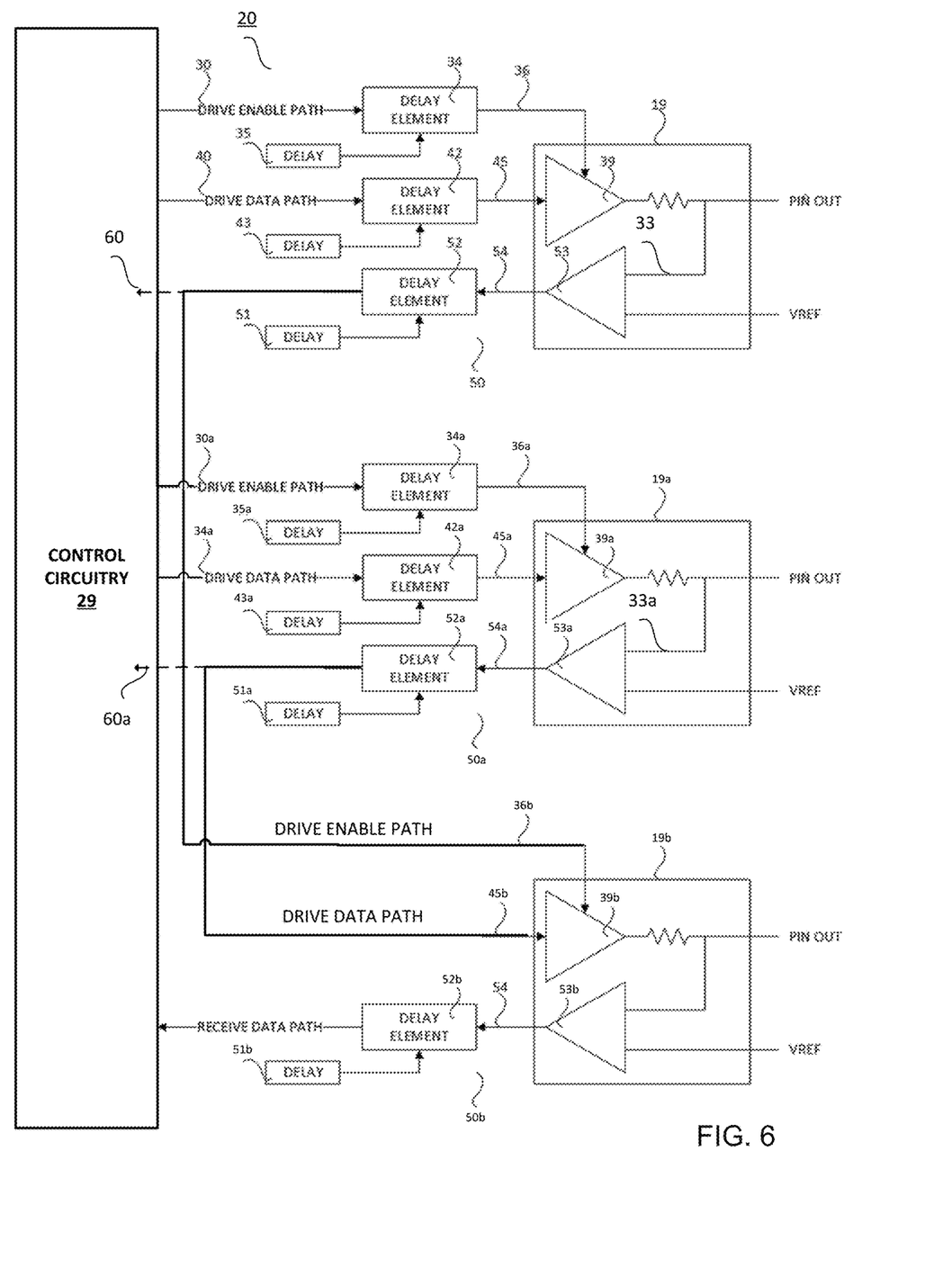
FIG. 6 is a block diagram showing components of an example communication channel that may be implemented using programmable logic.

In some implementations, the circuitry for one or more channels may control the input(s) to another channel. In the example of FIG. 6, an output of circuitry for channel 19 provides the drive enable signal to driver 39b of channel 19b, and an output of circuitry for channel 19a provides the drive data signal to driver 39b of channel 19b. In some implementations, although not shown, drive enable path 36b may include a delay element and delay corresponding to delay element 34 and delay 35; and in some implementations, although not shown, drive data path 45b may include a delay element and delay corresponding to delay element 42 and delay 43. Arrows 60 and 60a show the normal data path for paths 50 and 50a, respectively.

In some implementations, as noted, an output from one or more channels may function as the input to another channel. In the example of FIG. 6, the output of the detect (or, receive) portion 50 of channel 19 is applied to the drive enable path 36b, and the output of the detect (or, receive) portion 50a of channel 19a is applied to the drive data path 45b. The timing of those paths may be aligned, as described above, by providing appropriate programming to delay elements, such as 52 and 52a. For example, path 30 may receive a drive enable signal from control circuitry 29; the drive enable signal is output from driver 39, path 33 feeds the drive enable signal back into the FPGA where delay element 52 delays the drive enable signal by a programmed delay amount 51; and path 36b provides the drive enable signal to the enable/disable input of driver 39b. As also shown in FIG. 6, path 34a receives a drive data signal from control circuitry 29; the drive data signal is output from driver 39a, path 33a feeds the drive data signal back into the FPGA where delay element 52a delays the drive data signal by a programmed delay amount 51a; and path 45b provides the drive data signal to the input terminal of driver 39b for output in response to the drive enable signal. The drive data signal and the drive enable signal are aligned to control the output of driver 39b at, or about, the same time based on the programmed delays.

Controlling the timing of drive enable and drive data signals on a target channel using circuitry meant for one or more other channels can be beneficial, particularly in cases where the target channel does not include programmable delay elements in its drive enable and drive data paths. Also, controlling the timing of drive enable and drive data signals on a target channel using circuitry meant for one or more other channels may be implemented, e.g., where the one or more other channels are not used.

The example time-alignment processes are described in the context of ATE; however, they are not limited to use in that context. Rather, the example time-alignment processes have applicability in any system that employs channels having timing that may change, e.g., due to reconfiguration or other factors, such as changes in the environment or other change that affect signal timing. The example time-alignment processes may be implemented hardware and/or software. For example, the example time-alignment processes may be implemented by control circuitry 29 or by other parts of the ATE, such as one or more remote computing devices.

Testing performed by the example ATE/test system described herein may be implemented using hardware or a combination of hardware and software. For example, a test system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

In this regard, the operations described herein may be controlled and/or implemented by a computer. The operations may be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the operations described herein can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that may or may not include intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Wherever a specific numerical value is specified, that numerical value is to be taken as an example only and not limiting, except as otherwise specified herein.

Elements of different implementations described herein may be combined to form other implementations not specifically set forth above. Elements may be left out of the structures described herein without adversely affecting their operation. Furthermore, various separate elements may be combined into one or more individual elements to perform the functions described herein.

What is claimed is:

1. A method of aligning channels in automatic test equipment (ATE), comprising:
    programming a first delay associated with receiving first data over a channel so that timing of the channel is aligned to timings of other channels in the ATE;
    programming a second delay on a drive data path of a driver, the driver driving second data over the channel based on receipt of an edge of the second data so that timing of the second data is aligned to the timing of the channel;
    programming a third delay on a drive enable path of the driver, the third delay affecting a signal provided to an enable/disable input of the driver to enable the driver to drive the second data over the channel, the third delay being programmed to align timing of the signal to the timing of the channel, the third delay being based on an edge that corresponds to an edge of the signal created by controlling operation of the driver, the first delay, the second delay, and the third delay comprising fine delays; and
    programming coarse delays associated with receiving the first data over the channel and driving the second data over the channel, the coarse delays being longer in time than the fine delays;
    wherein the edge that corresponds to the edge of the signal is a reflected edge of the second data created by controlling operation of the driver, the reflected edge being produced by reflection of the second data created by controlling operation of the driver over an open-ended transmission line.

2. The method of claim 1, wherein controlling operation of the driver comprises:
    driving initial data in a first state;
    using the signal to turn the driver off for a period of time;
    pre-loading the driver with the second data in a second state; and
    using the signal to turn the driver on.

3. The method of claim 1, further comprising:
    receiving the edge of the second data;
    comparing the edge of the second data to a reference voltage; and
    determining the second delay based on the comparing.

4. The method of claim 1, wherein the edge of the second data is an incident edge of the second data.

5. The method of claim 1, wherein the edge of the second data is a reflected edge of the second data, the reflected edge being produced by reflection of the second data over an open-ended transmission line.

6. The method of claim 1, further comprising:
    receiving the edge that corresponds to the edge of the signal;
    comparing the edge that corresponds to the edge of the signal to an edge of the first data; and
    determining the third delay based on the comparing.

7. The method of claim 1, wherein controlling operation of the driver comprises turning the driver on and off.

8. The method of claim 1, wherein programming the first delay, programming the second delay, and programming the third delay are performed in any order.

9. The method of claim 1, wherein at least one of programming the first delay, programming the second delay, and programming the third delay comprises performing programming to achieve time-alignment to a common reference.

10. Automatic test equipment (ATE) comprising:
    a channel to send data to a unit under test (UUT), and to receive data from the UUT;
    a first circuit comprising a first delay element that is programmable, the first circuit being configured to receive first data over the channel;
    a second circuit comprising a second delay element that is programmable, the second circuit comprising a driver to drive second data over the channel, the second data element being on a drive data path of a driver;
    a third circuit comprising a third delay element that is programmable, the third circuit being configured to provide a signal to an enable/disable input of the driver to control operation of the driver, the third data element being on a drive enable path of the driver;
    wherein the first delay element is programmed with the first delay so that timing of the channel is aligned to timings of other channels on the ATE;
    wherein the second delay element is programmed with a second delay that is based on receipt of an edge of the second data so that timing of the second data is aligned to the timing of the channel;
    wherein the third delay element is programmed with the third delay to align timing of the signal to the timing of the channel, the third delay being based on an edge that corresponds to an edge of the signal created by controlling operation of the driver, the first delay, the second delay, and the third delay comprising fine delays; and
    control circuitry for applying coarse delays associated with receiving the first data over the channel and driving the second data over the channel, the coarse delays being longer in time than the fine delays;
    wherein the edge that corresponds to the edge of the signal is a reflected edge of the second data created by controlling operation of the driver, the reflected edge being produced by reflection of the second data created by controlling operation of the driver over an open-ended transmission line.

11. The ATE of claim 10, wherein the first delay element comprises one or more delay elements, the second delay element comprises one or more delay elements, and the third delay element comprises one or more delay elements.

12. The ATE of claim 11, wherein the first circuit, the second circuit, and the third circuit are implemented in programmable logic; and wherein timings associated with the second circuit and the third circuit change in accordance with programming of the programmable logic.

13. Non-transitory machine-readable storage media storing instructions that are executable to control alignment of channels in automatic test equipment (ATE), the instructions being executable to perform operations comprising:

programming a first delay associated with receiving first data over a channel so that timing of the channel is aligned to timings of other channels in the ATE;

programming a second delay on a drive data path of a driver, the driver for driving second data over the channel based on receipt of an edge of the second data so that timing of the second data is aligned to the timing of the channel;

programming a third delay on a drive enable path of the driver, the third delay affecting a signal provided to an enable/disable input of the driver to enable the driver to drive the second data over the channel, the third delay being programmed to align timing of the signal to the timing of the channel, the third delay being based on an edge that corresponds to an edge of the signal created by controlling operation of the driver; the first delay, the second delay, and the third delay comprising fine delays; and programming coarse delays associated with receiving the first data over the channel and driving the second data over the channel, the coarse delays being longer in time than the fine delays;

wherein the edge that corresponds to the edge of the signal is a reflected edge of the second data created by controlling operation of the driver, the reflected edge being produced by reflection of the second data created by controlling operation of the driver over an open-ended transmission line.

14. The non-transitory machine-readable storage media of claim 13, wherein controlling operation of the driver comprises:

driving initial data in a first state;
using the signal to turn the driver off for a period of time;
pre-loading the driver with the second data in a second state; and
using the signal to turn the driver on.

15. The non-transitory machine-readable storage media of claim 13 wherein the edge of the second data is an incident edge of the second data.

16. The non-transitory machine-readable storage media of claim 13, wherein the edge of the second data is a reflected edge of the second data, the reflected edge being produced by reflection of the second data over an open-ended transmission line.

* * * * *